(12) United States Patent
Fan

(10) Patent No.: US 7,919,851 B2
(45) Date of Patent: Apr. 5, 2011

(54) LAMINATE SUBSTRATE AND SEMICONDUCTOR PACKAGE UTILIZING THE SUBSTRATE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 443 days.

(21) Appl. No.: 12/133,841

(22) Filed: Jun. 5, 2008

(65) Prior Publication Data
US 2009/0302485 A1  Dec. 10, 2009

(51) Int. Cl.
*H01L 23/12* (2006.01)
(52) U.S. Cl. ........... 257/700; 257/E23.063; 257/684; 257/779; 257/786; 174/255; 438/125
(58) Field of Classification Search ........... 257/E23.069, 257/780, 684, 700, 738, 758, 778, 786, E23.062, 257/E23.063, 779, 737, 753, 787, 784; 174/52.1, 174/255, 256; 438/108, 125
See application file for complete search history.

(56) References Cited

U.S. PATENT DOCUMENTS

| | | | | |
|---|---|---|---|---|
| 6,084,295 A * | 7/2000 | Horiuchi et al. | ............ | 257/690 |
| 6,323,439 B1 * | 11/2001 | Kambe et al. | ............ | 174/262 |
| 6,329,610 B1 * | 12/2001 | Takubo et al. | ............ | 174/264 |
| 6,516,513 B2 * | 2/2003 | Milkovich et al. | ............ | 29/830 |
| 6,528,734 B2 * | 3/2003 | Mizunashi | ............ | 174/255 |
| 6,577,490 B2 * | 6/2003 | Ogawa et al. | ............ | 361/306.1 |
| 6,663,946 B2 * | 12/2003 | Seri et al. | ............ | 428/209 |
| 6,992,379 B2 * | 1/2006 | Alcoe et al. | ............ | 257/700 |
| 7,164,197 B2 * | 1/2007 | Mao et al. | ............ | 257/700 |
| 7,174,630 B2 * | 2/2007 | Hsu et al. | ............ | 29/842 |
| 7,199,462 B2 * | 4/2007 | Jang et al. | ............ | 257/700 |
| 7,247,951 B2 * | 7/2007 | Ho et al. | ............ | 257/786 |
| 7,382,057 B2 * | 6/2008 | Hsu | ............ | 257/778 |
| 7,528,480 B2 * | 5/2009 | Mihara | ............ | 257/700 |
| 7,605,463 B2 * | 10/2009 | Sunohara et al. | ............ | 257/700 |
| 7,692,313 B2 * | 4/2010 | Fan | ............ | 257/779 |
| 7,808,799 B2 * | 10/2010 | Kawabe et al. | ............ | 361/765 |
| 2006/0131067 A1 * | 6/2006 | Byun et al. | ............ | 174/260 |

* cited by examiner

*Primary Examiner* — Chris Chu
(74) *Attorney, Agent, or Firm* — Muncy, Geissler, Olds & Lowe, PLLC

(57) ABSTRACT

A laminated substrate and the semiconductor package utilizing the substrate are revealed. The laminated substrate primarily comprises a core layer, a first metal layer and a first solder mask disposed on the bottom surface of the core layer, and a second metal layer and a second solder mask disposed on the top surface of the core layer. The two solder masks have different CTEs to compensate potential substrate warpage caused by thermal stresses. Therefore, the manufacturing cost of the substrate can be reduced without adding extra stiffeners nor changing thicknesses of semiconductor packages to suppress substrate warpage during packaging processes. Especially, a die-attaching layer partially covers the second solder mask by printing and is planar after pre-curing for zero-gap die-attaching.

20 Claims, 3 Drawing Sheets

LAMINATE SUBSTRATE AND SEMICONDUCTOR PACKAGE UTILIZING THE SUBSTRATE

FIELD OF THE INVENTION

The present invention relates to a printed circuit board for semiconductor packages, especially to a laminated substrate and the semiconductor package utilizing the substrate.

BACKGROUND OF THE INVENTION

In the recently years, printed circuit boards have been developed toward high-density circuitry and high performance with miniature laminated substrates to be chip carriers for semiconductor packages. In the conventional semiconductor packaging processes, die-attaching materials are preformed on a substrate then pre-cured in order to adhere a chip to the substrate. Therefore, substrates will experience various heat treatments during semiconductor packaging processes such as pre-curing and post-curing of die-attaching material, reflow of bumps, curing of encapsulants, etc. However, due to mismatch of CTE (coefficient of thermal expansion) between substrates and other packaging materials such as die-attaching materials, chips and encapsulants, substrates will warpage and deform leading to difficult packaging processes.

As shown in FIG. 1, a substrate 100 for a conventional semiconductor package is formed by lamination, primarily comprising a core layer 110, a first metal layer 120, a second metal layer 130, a first solder mask 140, and a second solder mask 150. The core layer 110 includes glass fibers mixed with epoxy resin located at the intermediate layer of the substrate. Symmetrically, the first metal layer 120 is laminated on the bottom surface of the core layer 110 and the second metal layer 130 is laminated on the top surface of the core layer 110. The metal layers 120 and 130 are copper wiring layers including a plurality of conductive traces. To be more symmetric, the first solder mask 140 and the second solder mask 150 are respectively disposed on the bottom surface and top surface of the substrate 100 where the solder masks 140 and 150 are made of the same isolating material with the same CTE (coefficient of thermal expansion) and thickness to cover the conductive traces of the metal layers 120 and 130 with only a plurality of external pads 121 and a plurality of internal fingers 131 exposed for electrical connections for bonding solder balls 15 and bonding wires 13. Since the substrate 100 is a laminated substrate with symmetric structures, therefore, the impact of substrate warpage on substrate fabricating processes is not obvious.

As shown in FIG. 1 again, in semiconductor packaging processes, an electronic device such as a semiconductor chip 11 is disposed on the substrate 100 by a die-attaching layer 12 where the semiconductor chip 11 has a plurality of bonding pads 11A on its active surface electrically connected to the internal fingers 131 of the substrate 110 by a plurality of electrical connecting components 13 such as bonding wires formed by wire bonding so that the chip 11 is electrically connected with the substrate 100. Then, an encapsulant 14 is formed on the substrate 100 by molding to encapsulate the chip 11 and the electrical connecting components 13 to provide proper protections. Finally, a plurality of external terminals 15 such as solder balls are bonded to the external pads 121 on the bottom of the substrate 100 to form a BGA package.

Accordingly, above-mentioned semiconductor packaging processes include pre-curing and post-curing of the die-attaching layer 12, curing of the encapsulants 14, reflowing of external terminals 15, or TCT (Thermal Cycle Test), the substrate 100 will experience several heat treatments. Since the CTE of the substrate 100 may be different from the one of the die-attaching layer 12 or from the other packaging materials, unbalanced thermal stresses will be generated leading to substrate warpage during packaging processes, especially, when the die-attaching layer 12 is preformed on the substrate 100 and then pre-cured, the volume shrinkage of the die-attaching layer 12 will cause unbalanced stresses on the substrate 100 leading to substrate warpage. Therefore, the packaging yield will be lower due to void generated between the die-attaching layer 12 and the chip 11 during packaging processes.

SUMMARY OF THE INVENTION

The main purpose of the present invention is to provide a laminated substrate and the semiconductor package utilizing the substrate. Two solder masks disposed on the top and bottom surfaces of the substrate are of different CTEs (coefficients of thermal expansion) to compensate substrate warpage caused by thermal stresses. The manufacturing cost of the substrate can be reduced without adding extra stiffeners nor changing thicknesses of semiconductor packages to suppress substrate warpage during packaging processes.

According to the present invention, a laminated substrate is revealed, primarily comprising a core layer, a first metal layer, a second metal layer, a first solder mask, and a second solder mask. The first metal layer is formed on the first surface of the core layer and the second metal layer on the second surface of the core layer. The first solder mask is formed on the first surface of the core layer to cover the first metal layer and the second solder mask on the second surface of the core layer to cover the second metal layer. Additionally, the first solder mask and the second solder mask have the same thicknesses but with different CTEs to reduce warpage of the laminated substrate during semiconductor packaging processes.

DETAIL DESCRIPTION OF THE INVENTION

Please refer to the attached drawings, the present invention are described by means of embodiments below.

Figure 1:
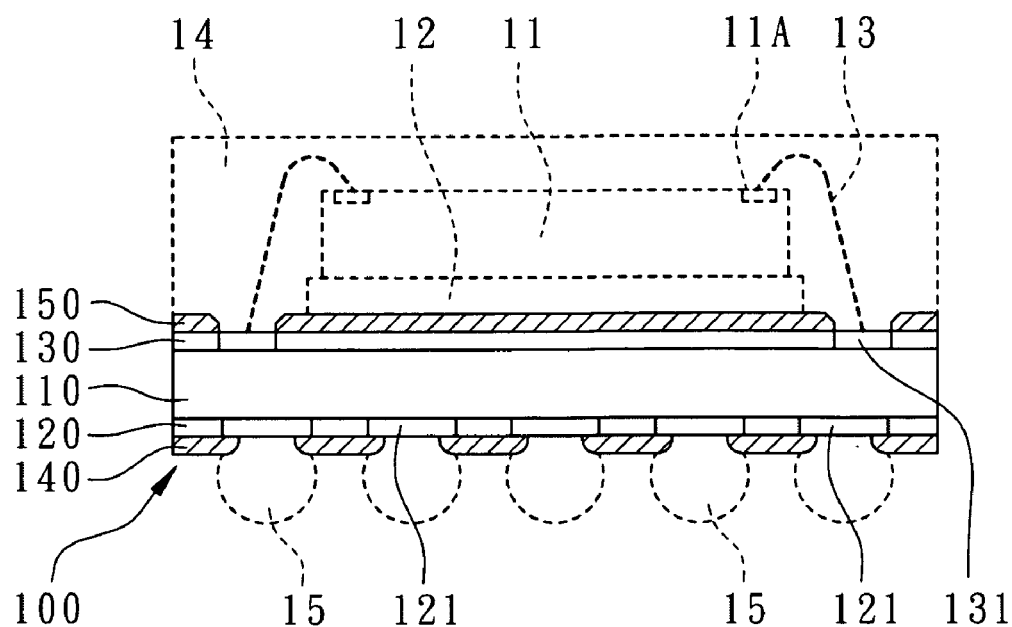
FIG. 1 shows a cross-sectional view of a laminated substrate for a conventional semiconductor package.
Figure 2:
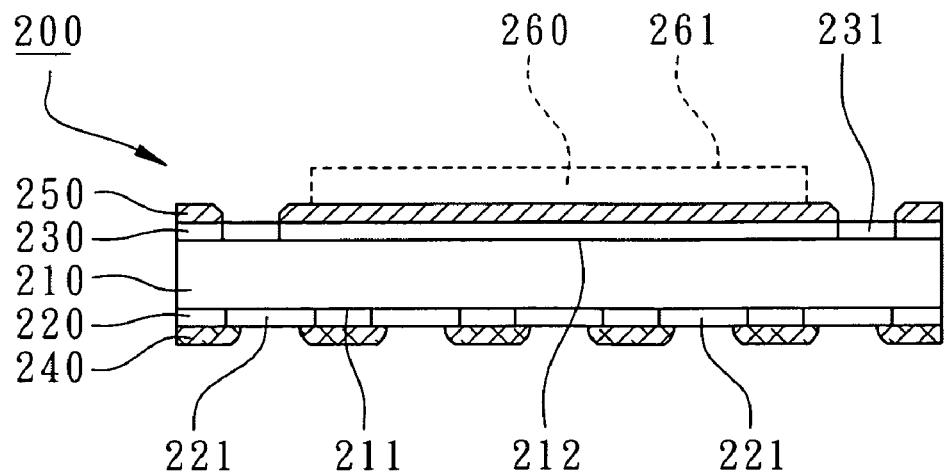
FIG. 2 shows a cross-sectional view of a laminated substrate according to the first embodiment of the present invention.

A laminated substrate according to the first embodiment of the present invention is illustrated in the cross-sectional view of FIG. 2. The laminated substrate 200 comprises a core layer 210, a first metal layer 220, a second metal layer 230, a first solder mask 240, and a second solder mask 250. The core layer 210 has a first surface 211 and a second surface 212. In the manufacturing processes of a laminated substrate, the core layer 210 is the base layer where the metal layers 220 and 230 and the solder masks 240 and 250 are sequentially disposed on the surfaces of the core layer 210. In other embodiments, the internal stacked layers or external added layers can be appropriately adjusted for easy trace layouts. The core layer 210 is the intermediate layer of the substrate 200 which includes glass fibers mixed with resins where the resin is chosen from epoxy resin, polyimide (PI) resin, bismaleimide trazine (BT) resin, FR4 resin, etc. The first metal layer 220 is formed on the first surface 211 of the core layer 210 and the second metal layer 230 on the second surface 212 of the core layer 210. In this embodiment, the first metal layer 220 and the second metal layer 230 are copper layers including a plurality of conductive traces formed by exposing, developing, and etching to form a wiring pattern. To be more specific, the first metal layer 220 is a trace layer including a plurality of external pads 221 and the second metal layer 230 is a trace layer including a plurality of internal fingers 231. The internal fingers 231 are electrically connected to the corresponding external pads 221 by plated through holes (PTH) of the substrate 200 (not shown in figures). The first solder mask 240 and the second solder mask 250 have a plurality of openings to expose the external pads 221 of the first metal layer 220 and the internal fingers 231 of the second metal layer 230 respectively.

The first solder mask 240 is formed on the first surface 211 of the core layer 210 to cover the first metal layer 220 and the second solder mask 250 on the second surface 212 of the core layer 210 to cover the second metal layer 230. The solder masks 240 and 250 are also called solder resist with green dyes added for easy visual inspection where the solder resist primarily includes epoxy resin and photo-sensitive resin printed on the surfaces of the core layer 210 to cover and protect the conductive traces of the metal layers 220 and 230 from moisture and contaminations. However, the colors of solder resist are not limited and various colors can be formulated such as black, red, blue, or others. The printing methods of the solder resist can be screen printing, curtain printing, spray printing, or roller printing. In different embodiment, the first solder mask 240 and the second solder mask 250 can be formed by laminating an epoxy resin dry film or by printing an epoxy liquid film followed by curing. The thicknesses of the first solder mask 240 and the second solder mask 250 are almost the same. Additionally, the first solder mask 240 and the second solder mask 250 have different CTEs to reduce warpage of the laminated substrate 200 during semiconductor packaging processes, especially at the die-attaching step.

Preferably, the substrate 200 further comprises a die-attaching layer 260 disposed and partially covering the second solder mask 250 for the die attaching processes. Preferably, the materials of the die-attaching layer 260 can be chosen from B-stage adhesive or other multiple-curing stage die-attaching material and is pre-formed on the substrate 200 before the die-attaching step. In one embodiment, the die-attaching layer 260 is a printed paste formed by stencil printing or screen printing and then solidified by pre-curing. By adjusting the CTE differences between the first solder mask 240 and the second solder mask 250 according to the degree of the substrate warpage measured by experiments when the two solder masks 240 and 250 have the same thickness and CTE, the solidified die-attaching layer 260 will have a planar die-attaching surface 261 parallel to the second surface 212 of the core layer 210. In different embodiments, the die-attaching layer 260 can be chosen from die-attaching tapes or adhesive paste.

Generally speaking, the thermal stresses induced by chips, solder balls, encapsulants on substrate warpage can be compensated by the CTEs of the first solder mask 240 and the second solder mask 250 in addition to the die-attaching layers 260. As shown in FIG. 2, in the present embodiment, the CTE of the die-attaching layer 260 is smaller than the one of the second solder mask 250 and the CTE of the first solder mask 240 is smaller than the one of the second solder mask 250 to compensate the thermal stresses exerted on the core layer 210. In different embodiments, the CTE of the die-attaching layer 260 is greater than the one of the second solder mask 250 and the CTE of the first solder mask 240 can be greater than the one of the second solder mask 250. By properly adjusting the CTE differences between the first solder mask 240 and the second solder mask 250 disposed on the bottom and top surfaces of the substrate 200 to compensate substrate warpage caused by the thermal stresses without increasing the package thicknesses. In order to determine the difference values between the CTEs of the first solder mask 240 and the second solder mask 250, ANSYS EDA tool with FEM (Finite Element Method) is implemented to find the optimum CTEs of the die-attaching layer 260, the first solder mask 240, and the second solder mask 250 to compensate the substrate warpage caused by thermal stresses exerted on the substrate 200. Generally speaking, the CTEs of solder masks 240 and 250 range from 60 to 160 ppm/° C., CTE of the core layer 210 around 16 ppm/° C., and CTEs and of the metal layers 220 and 230 around 16 ppm/° C. The actual CTEs of the first solder mask 240 and the second solder mask 250 can be measured by TMA (Thermal Mechanical Analyzer) to choose the most suitable solder masks for manufacturing the substrate 200.

Figure 3:
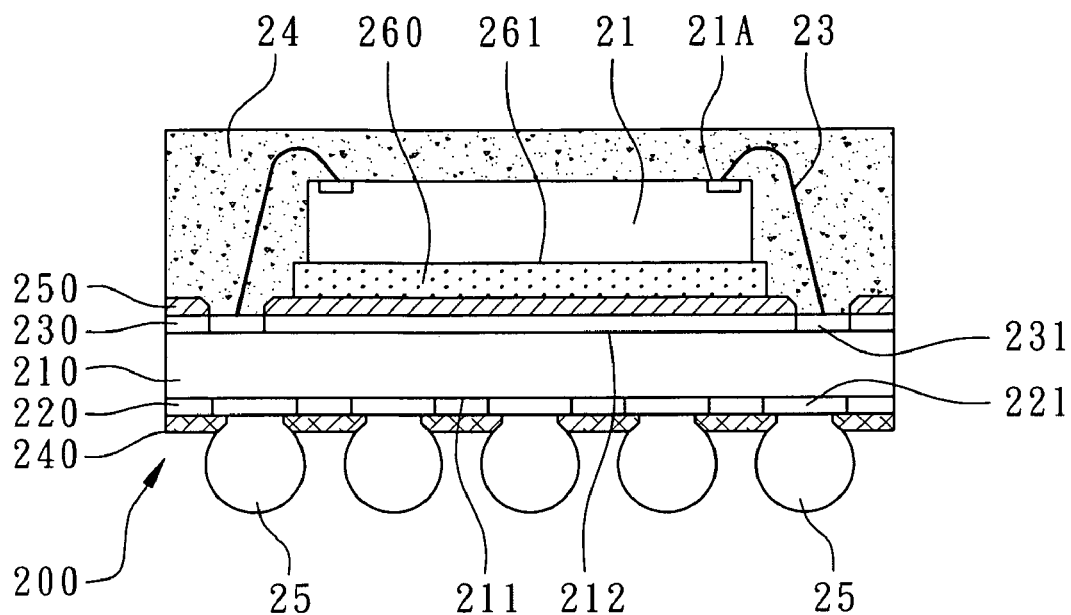
FIG. 3 shows a cross-sectional view of a semiconductor package using the laminated substrate according to the first embodiment of the present invention.

A semiconductor packaging process utilizing the substrate 200 is followed. As shown in FIG. 3, a semiconductor chip 21 is attached to the second solder mask 250 on the second surface 212 of the substrate 210 by the die-attaching layer 260 where the chip 21 has a plurality of bonding pads 21A on the active surface thereof. The bonding pads 21A are electrically connected to the internal fingers 231 of the first metal layer 230 by a plurality of electrical connecting components 23. In the present embodiment, the electrical connecting components 23 are bonding wires formed by wire bonding. Then, an encapsulant 24 is formed by molding or by dispensing to form on the second solder mask 250 on the second surface 212 of the substrate 200 to encapsulate the chip 21 and the electrical connecting components 23 to provide proper protections. Finally, a plurality of external terminals 25 are disposed on the external pads 221 on the first surface 211 of the substrate 200. The package having the substrate 200 then can be mounted onto an external printed circuit board for electrical connections to other devices. In the present embodiment, the external terminals 25 include a plurality of solder balls.

During semiconductor packaging processes with temperature gradients such as pre-curing and post-curing of the die-attaching layer 260, curing of the encapsulants 24, or reflowing of the external terminals 25, and during TCT (thermal cycle test), the first solder mask 240 and the second solder mask 250 will provide substrate warpage compensation so that the substrate 200 will not be seriously warpaged either in high nor low temperatures. Therefore, the substrate 200 will be stable during semiconductor packaging processes without substrate warpage caused by thermal stresses. Especially, during the die-attaching step of semiconductor packaging processes, the die-attaching layer 260 on the second solder mask 250 after pre-curing is planar since the substrate warpage caused by the thermal stresses is compensated by the CTE difference between the first solder mask 240 and the second solder mask 250. There is no void generated between the die-attaching layer 260 and the chip 21.

Figure 4:
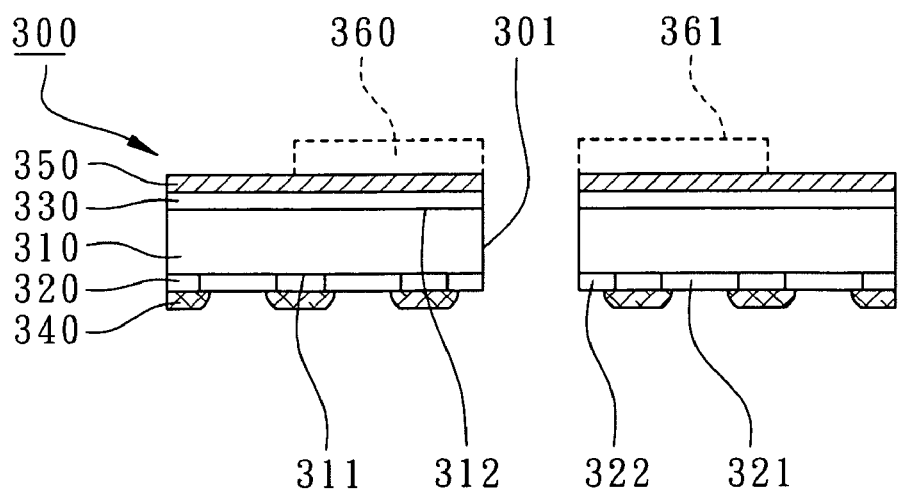
FIG. 4 shows a cross-sectional view of a laminated substrate according to the second embodiment of the present invention.

Another laminated substrate is revealed in the second embodiment of the present invention as shown in FIG. 4. A laminated substrate 300 primarily comprises a core layer 310, a first metal layer 320, a second metal layer 330, a first solder mask 340, and a second solder mask 350 almost the same as the core layer 210, the first metal layer 220, the second metal layer 230, the first solder mask 240, and the second solder mask 250 as described in the first embodiment. The core layer 310 has a first surface 311 and a second surface 312. The first metal layer 320 is formed on the first surface 311 of the core layer 310 and the second metal layer 330 on the second surface 312 of the core layer 310. The first solder mask 340 is formed on the first surface 311 of the core layer 310 to cover the first metal layer 320 and the second solder mask 350 on the second surface 312 of the core layer 310 to cover the second metal layer 330. The thicknesses of the first solder mask 340 and the second solder mask 350 are about the same and the first solder mask 340 and the second solder mask 350 are of different CTEs to reduce warpage of the laminated substrate 300.

As shown in FIG. 4 again, in the present embodiment, the substrate 300 further comprises a die-attaching layer 360 disposed and partially covered the second solder mask 350 for die attaching processes. Preferably, the die-attaching layer 360 is a solidified printed paste having a planar die-attaching surface 361 parallel to the second surface 312 of the core layer 310. In the present embodiment, the substrate 300 has a slot 301 penetrating the first solder mask 340, the first metal layer 320, the core layer 310, the second metal layer 330, and the second solder mask 350 for passing through the bonding wires 33 for wire bonding. Generally speaking, the slot 301 can be located at the center of the substrate 310 or other locations. In the present embodiment, the CTE of the die-attaching layer 360 is smaller than the one of the second solder mask 350, and the CTE of the first solder mask 340 is smaller than the one of the second solder mask 350. By using ANSYS simulation software with FEM to appropriately adjust the CTE differences between the first solder mask 340 and the second solder mask 350 to compensate the thermal stresses exerted on the substrate 300 due to different CTEs of die-attaching layer 360 or other packaging materials. Therefore, the warpage of the substrate 300 caused by thermal stresses can be lessened during semiconductor packaging processes.

In this embodiment, the first metal layer 320 is a trace layer including a plurality of external pads 321 and a plurality of internal fingers 322, and the first solder mask 340 have a plurality of openings to expose the external pads 321 and the internal fingers 322. Furthermore, the second metal layer 330 can be a dummy copper foil for heat dissipation and for electrical shielding.

Figure 5:
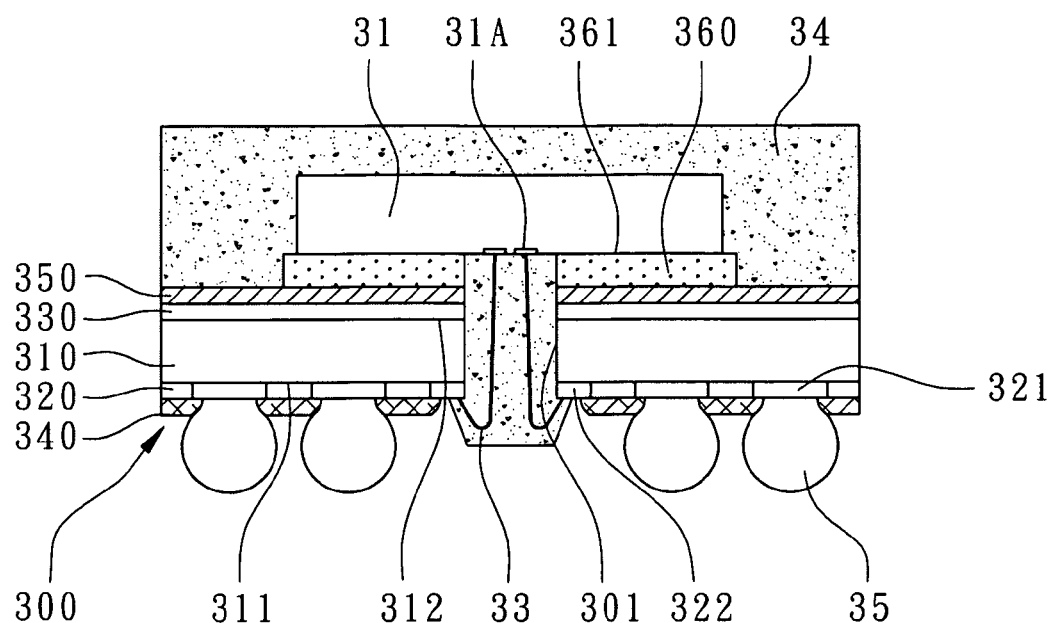
FIG. 5 shows a cross-sectional view of a semiconductor package using the laminated substrate according to the second embodiment of the present invention.

A semiconductor packaging process utilizing the laminated substrate 300 is followed. As shown in FIG. 5, a semiconductor chip 31 is attached to the second solder mask 350 on the second surface 312 of the substrate 310 by the die-attaching layer 360. And then a plurality of electrical connecting components 33 are formed to electrically connect a plurality of bonding pads 31A disposed on the active surface of the chip 31 to the internal fingers 322 of the first metal layer 320 of the substrate 300. In the present embodiment, the electrical connecting components 33 include a plurality of bonding wires formed by wire bonding. Then, an encapsulant 34 is formed on the second solder mask 350 and fills into the slot 301 by molding or by dispensing to encapsulate the chip 31 and the electrical connecting components 33 to provide proper protections. Finally, a plurality of external terminals 35 such as solder balls are disposed on the external pads 321 on the first surface 311 of the substrate 300. The external terminals 35 are electrically connected to the chip 31 for surface-mounting to an external printed circuit board.

During semiconductor packaging processes such as pre-curing and post-curing of the die-attaching layer 360, curing of the encapsulants 24 and reflowing of the external terminals 25, and during TCT, the different CTEs between first solder mask 340 and the second solder mask 350 with the same thickness will provide substrate warpage compensation so that the substrate 300 will be stable during packaging processes without substrate warpage caused by thermal stresses. Therefore, the substrate warpage can be well suppressed and controlled, especially for asymmetric laminated substrates.

In conclusions, according to the present invention, the die-attaching layer 360 on the substrate 300 is planar during semiconductor packaging processes especially the die-attaching step. This is because two solder masks with different CTEs are formed on the top and bottom surfaces of the core layer of the substrate to compensate substrate warpage caused by thermal stresses. Therefore, the in manufacturing cost of the substrate can be reduced without adding extra stiffeners nor changing thicknesses of semiconductor packages to suppress substrate warpage during semiconductor packaging processes.

The above description of embodiments of this invention is intended to be illustrative and not limiting. Other embodiments of this invention will be obvious to those skilled in the art in view of the above disclosure.

What is claimed is:

1. A laminated substrate primarily comprising:
   a core layer having a first surface and a second surface;
   a first metal layer formed on the first surface of the core layer;
   a second metal layer formed on the second surface of the core layer;
   a first solder mask formed on the first surface of the core layer to cover the first metal layer;
   a second solder mask formed on the second surface of the core layer to cover the second metal layer; and
   a die-attaching layer partially covering the second solder mask;
   wherein the thicknesses of the first solder mask and the second solder mask are the same and the first solder mask and the second solder mask have different CTEs to reduce warpage of the laminated substrate;
   wherein the CTE of the die-attaching layer is greater than the one of the second solder mask and the CTE of the first solder mask is greater than the one of the second solder mask.

2. The laminated substrate as claimed in claim 1, wherein the first metal layer is a trace layer including a plurality of external pads and the second metal layer is a trace layer including a plurality of internal fingers.

3. The laminated substrate as claimed in claim 1, wherein the die-attaching layer is a solidified printed paste having a planar die-attaching surface parallel to the second surface of the core layer.

4. A semiconductor package primarily comprising:
   a laminated substrate comprising:
      a core layer having a first surface and a second surface;
      a first metal layer formed on the first surface of the core layer;
      a second metal layer formed on the second surface of the core layer;
      a first solder mask formed on the first surface of the core layer to cover the first metal layer; and
      a second solder mask formed on the second surface of the core layer to cover the second metal layer;
      wherein the thicknesses of the first solder mask and the second solder mask are the same and the first solder mask and the second solder mask have different CTEs to reduce warpage of the laminated substrate;

a chip disposed on the second solder mask;

a plurality of electrical connecting components electrically connecting the chip to the first metal layer of the substrate; and an encapsulant disposed on the second solder mask to encapsulate the chip;

wherein the laminated substrate further comprises a die-attaching layer partially covering the second solder mask and adhering the chip;

wherein the CTE of the die-attaching layer is greater than the one of the second solder mask and the CTE of the first solder mask is greater than the one of the second solder mask.

5. The semiconductor package as claimed in claim 4, wherein the first metal layer is a trace layer including a plurality of external pads and the second metal layer is a trace layer including a plurality of internal fingers.

6. The semiconductor package as claimed in claim 5, further comprising a plurality of external terminals bonded on the external pads.

7. The semiconductor package as claimed in claim 6, wherein the external terminals include a plurality of solder balls.

8. The semiconductor package as claimed in claim 4, wherein the die-attaching layer is a solidified printed paste having a planar die-attaching surface parallel to the second surface of the core layer.

9. A laminated substrate primarily comprising:

a core layer having a first surface and a second surface;

a first metal layer formed on the first surface of the core layer;

a second metal layer formed on the second surface of the core layer;

a first solder mask formed on the first surface of the core layer to cover the first metal layer; and a second solder mask formed on the second surface of the core layer to cover the second metal layer;

wherein the thicknesses of the first solder mask and the second solder mask are the same and the first solder mask and the second solder mask have different CTEs to reduce warpage of the laminated substrate;

wherein the first metal layer is a trace layer including a plurality of external pads;

wherein the first metal layer further includes a plurality of internal fingers, wherein the second metal layer is a dummy copper foil.

10. The laminated substrate as claimed in claim 9, further comprising a die-attaching layer partially covering the second solder mask.

11. The laminated substrate as claimed in claim 10, wherein the CTE of the die-attaching layer is smaller than the one of the second solder mask and the CTE of the first solder mask is smaller than the one of the second solder mask.

12. The laminated substrate as claimed in claim 10, wherein the CTE of the die-attaching layer is greater than the one of the second solder mask and the CTE of the first solder mask is greater than the one of the second solder mask.

13. The laminated substrate as claimed in claim 9, further having a slot penetrating the first solder mask, the first metal layer, the core layer, the second metal layer, and the second solder mask.

14. A semiconductor package primarily comprising:

a laminated substrate comprising:

a core layer having a first surface and a second surface;

a first metal layer formed on the first surface of the core layer;

a second metal layer formed on the second surface of the core layer;

a first solder mask formed on the first surface of the core layer to cover the first metal layer; and a second solder mask formed on the second surface of the core layer to cover the second metal layer;

wherein the thicknesses of the first solder mask and the second solder mask are the same and the first solder mask and the second solder mask have different CTEs to reduce warpage of the laminated substrate;

a chip disposed on the second solder mask;

a plurality of electrical connecting components electrically connecting the chip to the first metal layer of the substrate; and an encapsulant disposed on the second solder mask to encapsulate the chip;

wherein the first metal layer is a trace layer including a plurality of external pads;

wherein the first metal layer further includes a plurality of internal fingers, wherein the second metal layer is a dummy copper foil.

15. The semiconductor package as claimed in claim 14, wherein the laminated substrate further comprises a die-attaching layer partially covering the second solder mask and adhering the chip.

16. The semiconductor package as claimed in claim 15, wherein the CTE of the die-attaching layer is smaller than the one of the second solder mask and the CTE of the first solder mask is smaller than the one of the second solder mask.

17. The semiconductor package as claimed in claim 15, wherein the CTE of the die-attaching layer is greater than the one of the second solder mask and the CTE of the first solder mask is greater than the one of the second solder mask.

18. The semiconductor package as claimed in claim 14, wherein the laminated substrate further having a slot penetrating the first solder mask, the first metal layer, the core layer, the second metal layer, and the second solder mask.

19. The semiconductor package as claimed in claim 14, further comprising a plurality of external terminals bonded on the external pads.

20. The semiconductor package as claimed in claim 14, wherein the external terminals include a plurality of solder balls.

* * * * *